United States Patent [19]

Brown

[11] Patent Number: 4,571,552
[45] Date of Patent: Feb. 18, 1986

[54] PHASE-LOCKED MAGNETRON SYSTEM

[75] Inventor: William C. Brown, Weston, Mass.

[73] Assignee: Raytheon Company, Lexington, Mass.

[21] Appl. No.: 750,990

[22] Filed: Jul. 2, 1985

Related U.S. Application Data

[63] Continuation of Ser. No. 549,128, Nov. 7, 1983, abandoned.

[51] Int. Cl.⁴ .......................... H03F 3/54; H03L 7/00
[52] U.S. Cl. ......................................... 330/47; 331/5; 331/25; 331/55
[58] Field of Search ................. 330/47, 48; 331/5, 25, 331/55, 88, 90

[56] References Cited

U.S. PATENT DOCUMENTS 2,724,778  11/1955  Jasik .......................................... 331/5
3,304,518  2/1967  Mackey ............................ 331/25 X Primary Examiner—James B. Mullins
Attorney, Agent, or Firm—Martin M. Santa; Richard M. Sharkansky

[57] ABSTRACT

Phase locking of the output signal of a magnetron with a frequency source signal is obtained by a phase comparison of the output signal and source signal to obtain an error signal which energizes a winding of the magnetron magnet to thereby change the flux experienced by the magnetron tube operating in conjunction with frequency pulling of the magnetron output signal by the source signal coupled to the magnetron by a three-port circulator.

9 Claims, 6 Drawing Figures

PHASE-LOCKED MAGNETRON SYSTEM

This application is a continuation of application Ser. No. 549,128 filed Nov. 7, 1983, now abandoned.

BACKGROUND OF THE INVENTION

This invention relates to locking the output phase of a magnetron directional amplifier to the phase of the drive signal in such a manner that high gain is achieved over a wide range of frequencies of the drive signal and temporal change in parameters that determine free running frequency of the magnetron.

In a prior art magnetron directional amplifier, shown in FIG. 1, phase locking of a magnetron is obtained by operating the magnetron 10 in combination with a passive directional device 11, such as a three-port circulator, having one port connected to a load 12 and the remaining port connected to a signal source 13. The injected drive signal for the signal source appears to the magnetron as a reflected component of the magnetron power output which acts to pull the operating frequency of the magnetron to that of the injected drive signal. A deficiency of this arrangement is that the ratio of the load power to the signal source power (the "gain") is low and is normally limited by practical considerations even if the amplifier is used at only a single frequency (no modulation). One of these considerations is that the higher the gain, the more closely the magnetron anode current level must be controlled in order to maintain phase lock. A further limitation to the use of this prior art arrangement is that the phase shift through the device is very sensitive to any difference between the operating frequency of the magnetron as a free running oscillator and the frequency of the signal source. For example, if the temperature of the anode block changes and therefore the natural frequency of the tube changes, a significant change in output phase shift from that of the input drive will occur. The sensitivity of the phase change to a number of external influences severely restricts the usefulness of the magnetron in phased arrays without additional phase shift compensation, usually provided by a phase comparator in the output and a phase shifting device connected between the signal source and the three-port circulator. The lack of high gain in the magnetron requires that the phase shifting device operate at a higher power level than that at which electronic phase shifters normally operate.

A further problem inherent in magnetron operation is the extreme sensitivity of its current flow (and therefore its output power) to a change in the voltage applied to the magnetron thereby making it necessary to use an expensive regulated power supply. Because of this same sensitivity, the phase shift through the tube is highly sensitive to any voltage ripple on the power supply.

SUMMARY OF THE INVENTION

The aforementioned problems are overcome and other objects and advantages of phase locking a magnetron are provided by a system, in accordance with the invention, which comprises an improvement to the prior art phase locking system of FIG. 1 which comprises additional circuitry for comparing the phase of the output of the magnetron at the load with the phase of the signal source to provide an error signal which is amplified and provided to an auxiliary coil mounted on the magnet which provides the magnetic field for the magnetron tube.

BRIEF DESCRIPTION OF THE DRAWINGS

The aforementioned aspects and other features of the invention are explained in the following description taken in conjunction with the accompanying drawings wherein.

DESCRIPTION OF THE PREFERRED EMBODIMENT

Figure 1:
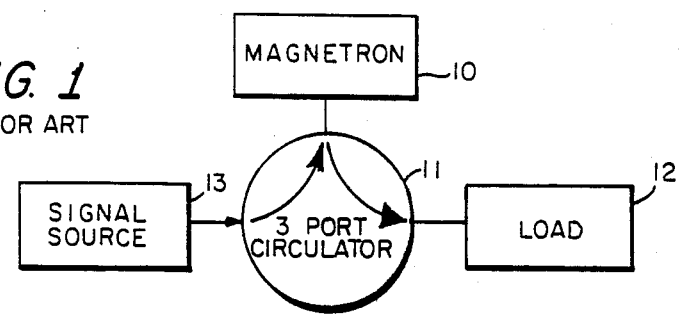
FIG. 1 is a block diagram of a prior-art phase locking circuit.
Figure 2:
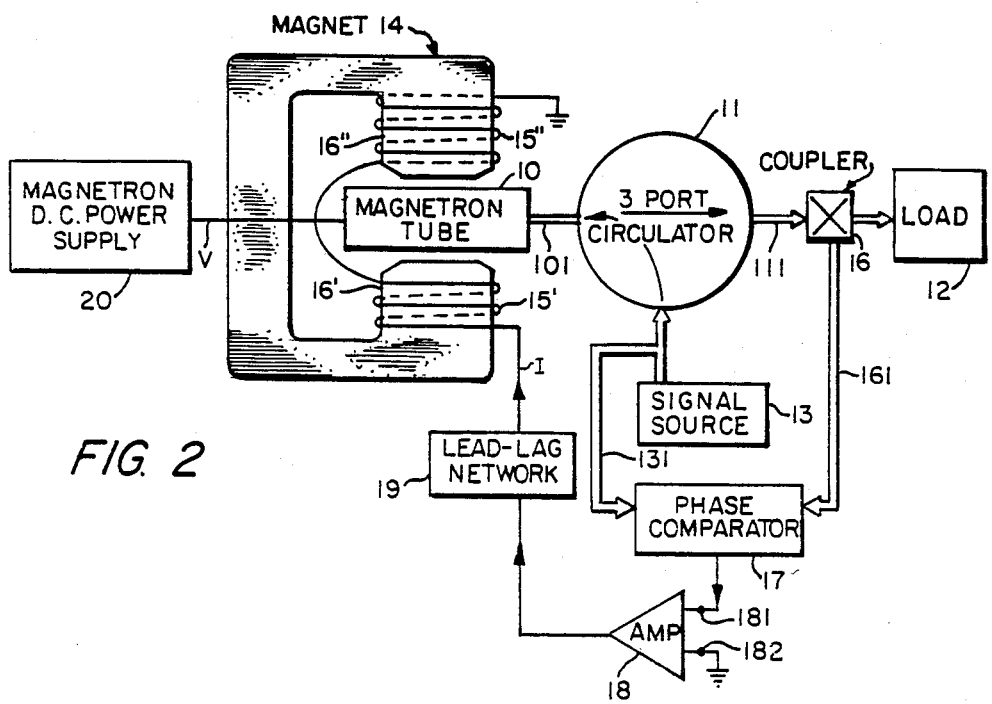
FIG. 2 is a block diagram of a preferred embodiment of the invention.

FIG. 2 is a block diagram of a preferred embodiment of the invention which provides phase locking of the output of a magnetron. Magnetron tube 10 is provided with a magnet 14 which may be either a permanent magnet as shown in FIG. 1 or an electromagnet. In accordance with this invention, the magnetic field provided by the magnet 14 to the magnetron 10 is either increased or decreased by providing the magnetic circuit of which magnet 14 is a part with magnetic windings 15', 15" which are energized in series from direct-current from amplifier 18. FIG. 2 shows two separate windings 15', 15" on the poles 16', 16", respectively, in a series electrical connection with a current I providing flux in the same direction. However, a single coil located on one pole has been found to supply sufficient change in the magnetic field in which the magnetron tube 10 is immersed to provide the desired phase locking in accordance with the invention.

The RF output of the magnetron tube 10 is provided through waveguide 101 as one input to a three-port circulator 11. The other input to the circulator 11 is provided by signal source 13 whose output is provided through the circulator 11 to the magnetron 10 thereby "pulling" the output frequency of the magnetron 10 to the frequency of the source 13 as in the prior art.

The magnetron RF power output passes through the three-port circulator and appears at the output line 111 which provides the input to an RF coupler 16. Most of the power entering the coupler 16 on the line 111 is provided to the load 12. However, a very small amount (comparable to that provided by the signal source 13) sufficient to operate the phase comparator 17 is provided on line 161 to the comparator 17. The other input to the phase comparator 17 is provided by the signal source 13 on RF microwave line 131. The phase comparator 17 compares the phase of the RF signals applied on its input lines 131, 161 which are the phases of the signal source 13 and the magnetron 10 output at load 12. Typically, the phase comparator will provide a zero DC level when its input signals are in phase with one another, and a maximum positive and negative signal when the phase relationship of its input signals is +90° and −90°, respectively. The DC signal out of the phase comparator at terminal 181 is amplified by a high-gain direct current amplifier 18 and is then provided to the windings 15', 15" on the magnet 14 to change the flux produced in the magnetron tube 10 in accordance with the amplitude of the current I provided by the amplifier 18. The amplifier 18 may be a differential amplifier that amplifies positive or negative signals on terminal 181 to provide a positive or negative current I, respectively. The output current I is a function of the difference between the signal levels applied at the inputs 181, 182. The direction of the output current flow I from the amplifier 18 is determined by whether the natural operating frequency of the tube is above or below the drive frequency. The operating point of the magnetron tube (magnetic field, voltage, and current) is established to provide a natural operating frequency which is phase locked with the signal source 13 in the middle of the desired phase-lock frequency range when the phase comparator 17 has near zero output.

The invention has been described thus far without utilization of the lead-lag network 19. The absence of lead-lag network 19 provides a control circuit that is of the simplest kind and is inherently stable. However, faster response time and reduced steady-state phase shift between the signal source 13 and output at load 12 can be achieved by lead and lag circuitry contained in the lead-lag network 19. The additional cost of the network 19 is substantially negligible because of its location in the control loop where the power level being handled is negligible, and where the additional gain necessary when lead-lag compensation is used can be easily obtained. In accordance with conventional servo system design, it may be desirable that network 19 be only a lead network or a lag network.

Figure 3:
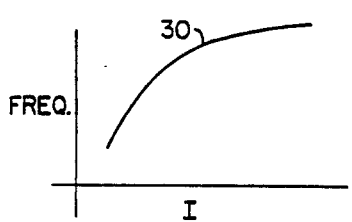
FIGS. 3 and 4 are graphs of operating characteristics of a magnetron.
Figure 4:
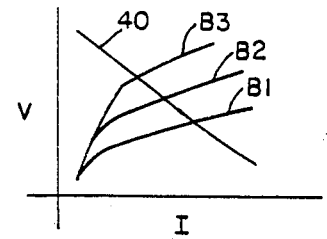

FIGS. 3 and 4 show typical operating characteristics of a magnetron tube 10 such as that which might be used in the phase lock system of FIG. 2. In FIG. 3, curve 30 shows the frequency output of a magnetron as a function of the current through the tube for a fixed value of magnetic flux density. It is observed that the output frequency is substantially affected by the current through the tube. FIG. 4 shows the volt/ampere characteristic curves of the magnetron as a function of different magnetic fields B1, B2, B3 applied to the magnetron tube. A load line 40 resulting from a load connected to the output of a magnetron shows that there is substantial change in the voltage across the magnetron and the current through the magnetron with a change in the magnetic field applied to the tube. These properties of the magnetron exhibited in FIGS. 3 and 4 are utilized in the phase locking system of FIG. 2.

In order to lock the output frequency of the magnetron to the signal source with a minimum of phase shift, the free-running frequency should be caused to be near to the frequency of the signal source. Since the natural frequency of the magnetron 10 is a sensitive function of the current through the tube as seen in FIG. 3, the control of the current through the tube can be used to control frequency. It further appears from the characteristic curves of FIG. 4 that changing the flux through the magnetron tube while maintaining the load line and the voltage V applied to the magnetron at a constant level will result in substantial change in the current through the tube and hence a substantial change in the frequency of the magnetron tube 10. It is these properties which are utilized in the circuitry of FIG. 2 where the magnetic flux through the tube is changed to cause the natural frequency of the magnetron 10 to be close to that of the signal source prior to being pulled into a phase locked state by coupling through the three-port circulator 11.

Figure 5:
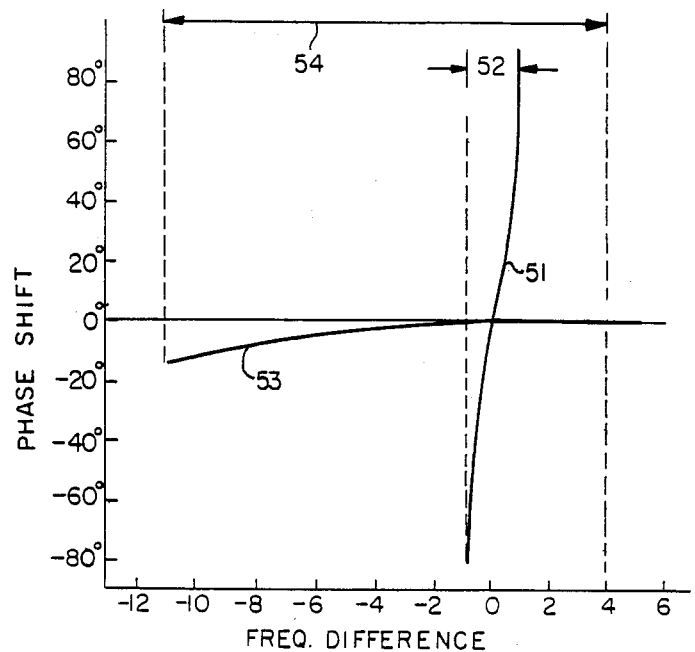
FIG. 5 is a plot of the phase locking characteristics of the circuits of the prior art and the invention.

FIG. 5 provides a comparison between the phase locking capability of the system of this invention, shown in FIG. 2, with the phase locking capability of the prior art circuit, shown in FIG. 1. The frequency difference of FIG. 5 is the difference between the frequency of the signal source 13 and the free-running frequency of the magnetron tube when the value of the current I through the auxiliary coils 15', 15" is zero. FIG. 5 also shows the phase shift of the output signal at the load 12 relative to the phase of the signal source 13.

Curve 51 shows the phase shift and the frequency difference locking range 52 obtained with a magnetron when used in the prior art circuit of FIG. 1 at high gain levels of 32 db with a drive power of 0.2 watts. Typically, for a gain level of 32 db, the prior art locking range 52 extends over only one or two megacycles from the free-running or natural frequency of the magnetron (2.450 GHz). The phase shift between the frequency of the signal source 13 and the load 12 is seen to vary from $-80°$ to $+80°$ over the locking range 52. The deficiencies of the prior art phase locking technique of FIG. 1 is clearly demonstrated by curve 51 of FIG. 5. The limited frequency range over which locking occurs and the large phase shift over this locking range substantially reduces the utility of the circuit of FIG. 1 for many magnetron applications such as in a phased array antenna where it is desired to keep the input power level low so that an electronic phase shifter can be used.

Referring again to FIG. 5, curve 53 depicts data obtained using the circuit of the invention, shown in FIG. 2 with the same drive level and gain as for FIG. 1. It is obverved that the locking range 54 has been increased to approximately 15 MHz for the same natural frequency as stated in the preceding paragraph, and the phase shift over this locking frequency range is only 15°. The improved performance of the circuit of this invention over the prior art in providing a ten fold improvement in the locking frequency range and in minimizing phase shift is apparent. The resulting phase locking and high gain capability are such that application of phase locked magnetrons in phased array antenna systems is feasible.

Figure 6:
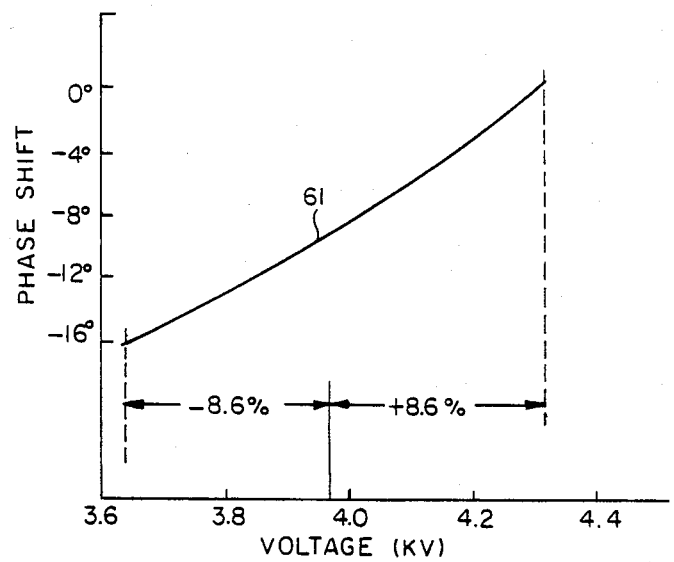
FIG. 6 is a plot of the phase shift experienced by a phase-locked magnetron as a function of voltage across the magnetron.

Referring now to FIG. 6, there is shown a plot of the phase shift between the output signal at the load 12 and the signal from the signal source 13 for a fixed frequency as a function of the voltage V applied to the magnetron anode in kilovolts by the magnetron DC power supply 20. It is seen that a change of $\pm 8.6\%$ in the voltage V applied to the magnetron 10 causes only a 16° phase shift. Therefore, the effectiveness of the system of FIG. 2 in reducing the effects of power supply ripple or for voltage regulation is amply demonstrated by curve 61 of FIG. 6. Therefore, substantial economies in the design of the power supply for the magnetron are available because of the use of the invention shown in FIG. 2.

Having described a preferred embodiment of the invention, it will be apparent to one of skill in the art that other embodiments incorporating its concept may be used. It is felt, therefore, that this invention should not be restricted to the disclosed embodiment but rather should be limited only by the spirit and scope of the appended claims.

What is claimed is:

1. A magnetron phase locking system comprising:
a microwave circulator having three ports;
a microwave signal source connected to one port;
a magnetron tube output connected to a second port;

a microwave coupler having an input port and two output ports, the input port being connected to the third port of said circulator;

a load connected to one output port of said coupler;

a phase comparator means having one input connected to said signal source and another input connected to the second output of said coupler;

a magnet providing a magnetic field to said magnetron tube;

a winding on said magnet connected to the output of said phase comparator means to change the magnetic field in response to the output signal of said phase comparator.

2. The phase locking system of claim 1 comprising in addition:

an amplifier having its output connected to said winding and its input connected to said phase comparator output.

3. The phase locking system of claim 2 comprising in addition:

a lead-lag network serially connected between said winding and said amplifier output.

4. The phase locking system of claim 2 comprising in addition:

a lead network serially connected between said winding and said amplifier output.

5. The phase locking system of claim 2 comprising in addition:

a lag network serially connected between said winding and said amplifier output.

6. A magnetron phase locking system comprising:

a magnetron having means for providing a magnetic field;

an input signal source;

means for providing said input signal to said magnetron; and means for comparing the phase of the output signal of said magnetron and said input signal to provide an error signal which is provided to said magnetic field means to change the strength of said magnetic field in response to said error signal to thereby lock the frequency of said magnetron to said signal source.

7. The magnetron phase locking system of claim 6 wherein said means for comparing the phase of the output signal of said magnetron comprises:

a load;

a coupler connected between said load and said magnetron to provide said magnetron output signal;

a phase comparator having inputs connected to said magnetron output signal coupler and said input signal source to provide said error signal at its output.

8. The magnetron phase locking system of claim 7 wherein said means for providing a magnetic field comprises:

an amplifier having its input connected to said phase comparator output;

a permanent magnet; and a winding on said permanent magnet connected to the output of said amplifier.

9. A magnetron phase locking system comprising:

a microwave circulator having three ports;

a microwave signal source connected to one port;

a magnetron tube output connected to a second port;

a microwave coupler having an input port and two output ports, the input port being connected to the third port of said circulator;

a load connected to one output port of said coupler;

a phase comparator means having one input connected to said signal source and another input connected to the second output of said coupler;

a magnet providing a magnetic field to said magnetron tube;

a lead-lag network; and a winding on said magnet connected by said lead-lag network to the output of said phase comparator means to change the magnetic field in response to the output signal of said phase comparator.

* * * * *